United States Patent
Swaminathan (10) Patent No.: US 9,476,141 B2
(45) Date of Patent: Oct. 25, 2016

(54) WEIR FOR INHIBITING MELT CONTAMINATION

(71) Applicant: SunEdison, Inc., St. Peters, MO (US)

(72) Inventor: Tirumani Swaminathan, Houston, TX (US)

(73) Assignee: SunEdison, Inc., Maryland Heights, MO (US)

( * ) Notice: Subject to any disclaimer, the term of this patent is extended or adjusted under 35 U.S.C. 154(b) by 278 days.

(21) Appl. No.: 14/341,584

(22) Filed: Jul. 25, 2014

(65) Prior Publication Data

US 2016/0024684 A1    Jan. 28, 2016

(51) Int. Cl.
*C30B 15/12* (2006.01)
*C30B 15/02* (2006.01)
*C30B 29/06* (2006.01)

(52) U.S. Cl.
CPC ............ *C30B 15/12* (2013.01); *C30B 15/02* (2013.01); *C30B 29/06* (2013.01); *Y10T 117/1052* (2015.01); *Y10T 117/1064* (2015.01)

(58) Field of Classification Search
CPC ..... C30B 15/12; C30B 15/002; C30B 15/02; Y10T 117/1052; Y10T 117/1056; Y10T 117/1064
USPC ................ 117/213, 30, 31, 34, 217, 222
See application file for complete search history.

(56) References Cited

U.S. PATENT DOCUMENTS

| 5,474,022 A | 12/1995 | Abe et al. |
| 5,580,171 A * | 12/1996 | Lim ................ B01F 5/064 117/213 |
| 5,720,810 A | 2/1998 | Arai et al. |
| 6,261,364 B1 * | 7/2001 | Arai ................ C30B 15/12 117/213 |
| 8,262,797 B1 * | 9/2012 | Bender ............. C30B 29/06 117/217 |
| 8,317,919 B2 | 11/2012 | Bender |
| 2001/0017100 A1 * | 8/2001 | Meier ............... C30B 15/007 117/18 |
| 2013/0233237 A1 * | 9/2013 | Bender ............. C30B 29/06 117/31 |
| 2014/0144371 A1 * | 5/2014 | Swaminathan ...... C30B 15/14 117/13 |
| 2014/0144372 A1 * | 5/2014 | Swaminathan ...... C30B 29/06 117/13 |
| 2014/0261155 A1 * | 9/2014 | Kimbel .............. C30B 15/12 117/31 |
| 2015/0233014 A1 * | 8/2015 | Luter ................ C30B 15/12 117/31 |

FOREIGN PATENT DOCUMENTS

| JP | H029782 A | 1/1990 |
| WO | 2014152852 A2 | 9/2014 |
| WO | 2014159879 A1 | 10/2014 |

OTHER PUBLICATIONS

International Search Report and Written Opinion of the International Searching Authority issued in connection with PCT/US2015/041740 mailed on Oct. 14, 2015, 11 pgs.

* cited by examiner

*Primary Examiner* — Matthew Song
(74) *Attorney, Agent, or Firm* — Armstrong Teasdale LLP (57) ABSTRACT

A system for growing a crystal ingot from a melt is provided. The system includes a first crucible, a barrier, and a shield. The first crucible has a first base and a first sidewall forming a first cavity for containing the melt. The barrier is disposed within the first cavity of the first crucible to inhibit movement of the melt from outward of the barrier to inward of the barrier. The barrier extends from the first base to above the melt. The barrier has an inner arm and an outer arm extending upward to form a channel therebetween. The shield extends downward between the inner arm and the outer arm to inhibit passage of contaminants.

20 Claims, 5 Drawing Sheets

WEIR FOR INHIBITING MELT CONTAMINATION

FIELD

This disclosure generally relates to systems and methods for the production of ingots of semiconductor or solar material and more particularly to systems and methods for reducing defects or dislocations in the ingots.

BACKGROUND

In the production of single silicon crystals grown by the Czochralski (CZ) method, polycrystalline silicon is first melted within a crucible, such as a quartz crucible, of a crystal pulling device to form a silicon melt. The puller then lowers a seed crystal into the melt and slowly raises the seed crystal out of the melt, solidifying the melt onto the seed crystal. To produce a single high quality crystal using this method, the stability of the surface of the melt immediately adjacent to the ingot must be maintained substantially constant. Prior systems for accomplishing this goal have not been completely satisfactory. Thus, there exists a need for a more efficient and effective system and method to limit surface disruptions in the melt adjacent to the ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a system for growing a crystal ingot from a melt is provided. The system includes a first crucible, a barrier, and a shield. The first crucible has a first base and a first sidewall forming a first cavity for containing the melt. The barrier is disposed within the first cavity of the first crucible to inhibit movement of the melt from outward of the barrier to inward of the barrier. The barrier extends from the first base to above the melt. The barrier has an inner arm and an outer arm extending upward to form a channel therebetween. The shield extends downward between the inner arm and the outer arm to inhibit passage of contaminants.

In another aspect, a system for growing a crystal ingot from a melt is provided. The system includes a first crucible, a barrier, a divider disposed on top of the barrier, and a shield. The first crucible has a first base and a first sidewall forming a first cavity for containing the melt. The barrier is disposed within the first cavity of the first crucible to inhibit movement of the melt from a location outward of the barrier to a location inward of the barrier. The divider has an upwardly extending inner arm and an upwardly extending outer arm. The shield extends downward between the inner arm and the outer arm to inhibit passage of contaminants.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
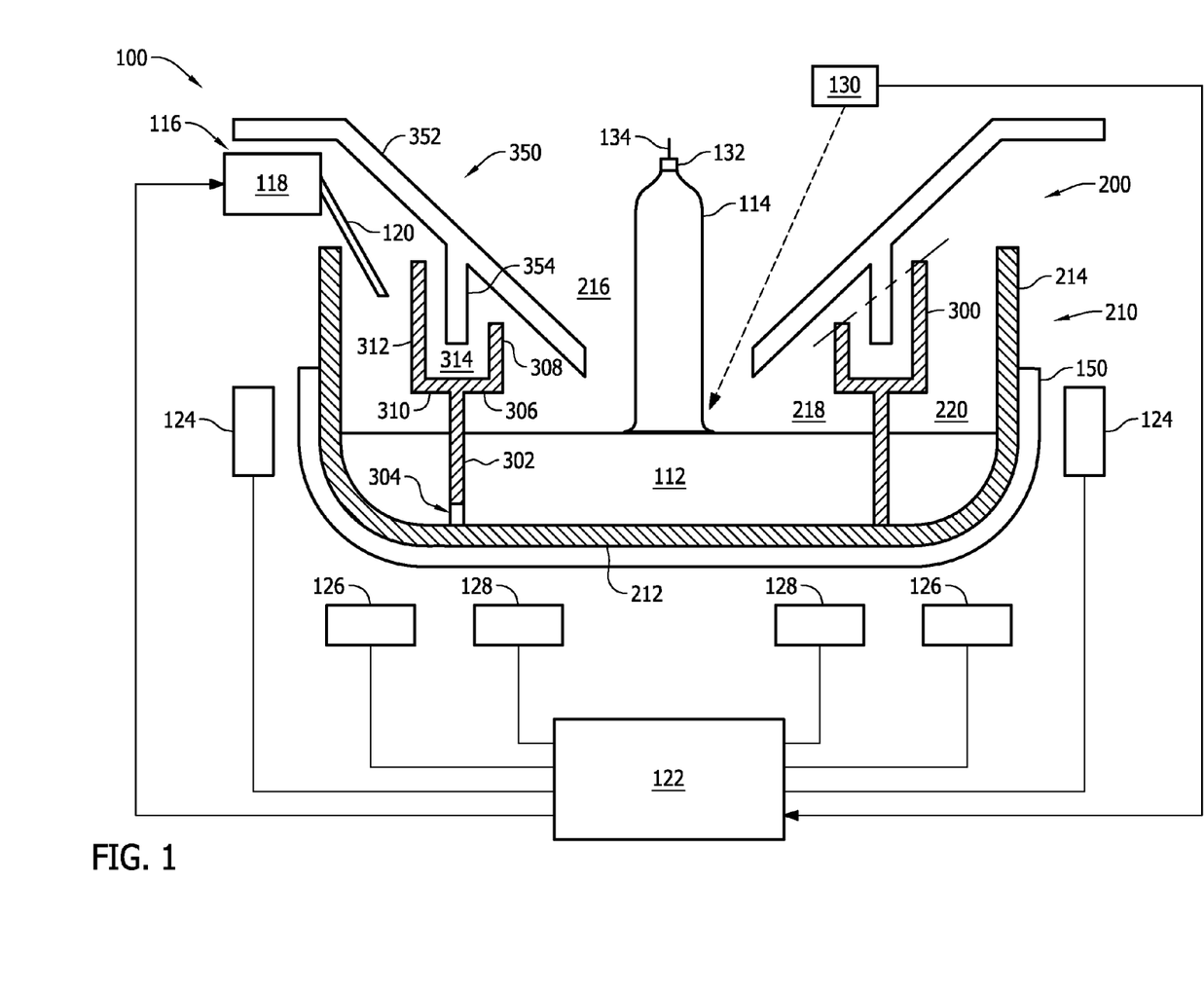
FIG. 1 is a cross-sectional view of a crystal growing system in accordance with one embodiment.

Referring to FIG. 1, a crystal growing system is shown schematically and is indicated generally at 100. The crystal growing system 100 is used to produce a single crystal ingot by a Czochralski method. As discussed herein, the system is described in relation to the continuous Czochralski method of producing single crystal ingots, though a batch process may be used. However, the system disclosed herein may also be used to produce multi-crystalline ingots, such as by a directional solidification process.

The crystal growing system 100 includes a crucible support or susceptor 150 supporting a crucible assembly 200 that contains silicon melt 112 from which an ingot 114 is being pulled by a puller or pull system 134 e.g., a cable. During the crystal pulling process, a seed crystal 132 is lowered by the puller 134 into the melt 112 and then slowly raised or pulled from the melt. As seed crystal 132 is slowly raised from melt 112, the single crystal ingot 114 is formed.

The crucible assembly 200 includes a first crucible 210 having a first base 212 and a first sidewall 214. The sidewall 214 of the crucible 210 is approximately concentric with the puller 134. The sidewall 214 extends around the circumference of the base 212. The sidewall 214 and the base 212 form a first cavity 216. In some embodiments, the crucible 210 may have an internal radius of 32-inches, or the dimensions may be greater for lower oxygen or smaller for lower cost.

During the continuous Czochralski method of producing single crystal ingots, feedstock is supplied to and melted in a radially outward area of the crucible, while the crystal ingot is simultaneously being grown from the melt. One or more silica barriers or weirs are located between where the feedstock is supplied and where the crystal ingot is pulled, to form a crucible assembly. These weir(s) create multiple zones within the crucible assembly and inhibit unmelted or solid feedstock from passing into an area that is immediately adjacent to the growing crystal. Pieces or fragments of solid feedstock in the inner area or zone located within the melt are colloquially referred to as "fish."

Typically, weir(s) are quartz pipes that are placed within a crucible. In many instances, the bottoms of the weirs do not form perfect barriers with the crucibles to prevent solid feedstock from entering the inner zone. As a result, solid feedstock may pass through small gaps between the bottom of the weir(s) and the crucible. The passage of the solid feedstock into an area adjacent to a forming crystal ingot greatly increases the risk of the ingot being hit and having its crystalline structure disrupted (sometimes called loss-of-structure or LOS). Using embodiments of this disclosure, during the crystal ingot growing process, these fish are inhibited from entering the inner zone and causing a defect or dislocation in the crystal ingot.

Figure 2:
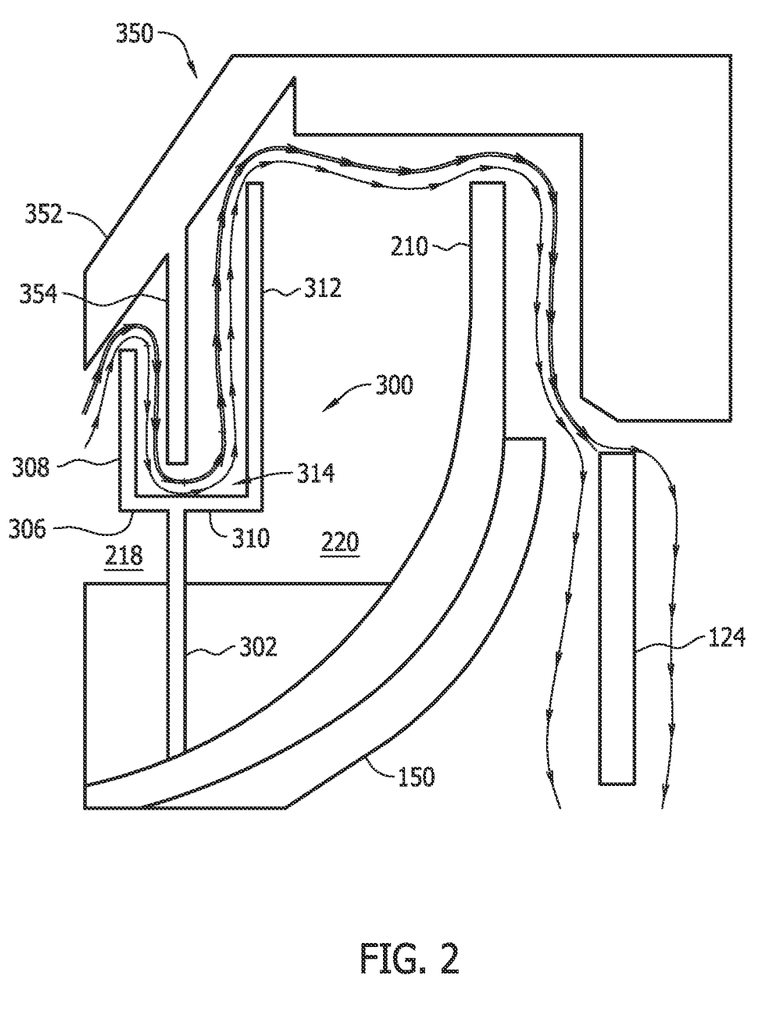
FIG. 2 is an enlarged cross-sectional view of a crucible assembly of FIG. 1.

In this embodiment, a cylindrical melt flow barrier or weir 300 is disposed within the cavity 216 along the base 212 at a location inward from the sidewall 214. The weir 300 separates the area within the cavity 216 into an inner zone 218 and an outer zone 220. The inner zone 218 is defined by the base 212 and an area inward of the weir 300. The outer zone 220 is defined by the base 212, the sidewall 214, and the weir 300. The weir 300 inhibits movement of the melt 112 from a location outward of the weir, the outer zone 220, to a location inward of the weir 300, the inner zone 218. In this embodiment, the weir 300 includes a body 302 having at least one weir passage 304 extending through the body to allow melt in the cavity 216 to move inward of the weir 300. The weir passage 304 is disposed along a lower section of weir 300 at an elevation below the ultimate melt depth to allow consistent melt levels inward of the weir 300. The weir 300 has an inner shoulder 306 connected with an upwardly extending inner arm 308, and an outer shoulder 310 connected with an upwardly extending outer arm 312. The shoulders 306, 308 are perpendicular to the body 302. In other embodiments, the shoulders 306, 310 are at an oblique angle with the body 302. In the illustrated embodiment, the weir 300 has a unitary construction. That is, the body 302, the shoulders 306, 310, and the arms 308, 312 are formed as a single unit (e.g., from a unitary piece of material, such as quartz). In other embodiments, the weir 300 may have a modular construction. That is, the body 302, the shoulders 306, 310, and/or the arms 308, 312 may be formed separately from one another and joined together to form the weir 300. In one embodiment, for example, the shoulders 306, 310 and the arms 308, 312 are formed from a unitary piece of quartz, and the body 302 is formed from a separate piece of quartz.

The shoulders 306 and 310 together form a pedestal, and upwardly extending arms 308 and 312 form an annular channel 314 that is elevated or spaced above the base 212. As shown, the upwardly extending arms 308 and 312 are parallel to each other and have different lengths. In other embodiments, the upwardly extending arms 308 and 312 may be at an oblique angle with each other. In some embodiments, the upwardly extending arms 308 and 312 may be of substantially equal lengths.

In some embodiments, the weir 300 is bonded to the base 212. In other embodiments, the weir 300 does not include a passage or notch extending through the body. In these embodiments, the melt passes from the outer zone 220 to the inner zone 218 by flowing between the weir 300 and base 212.

In some embodiments, the weir 300 may be a 20-inch quartz cylinder that has a bottom edge shaped to conform to the contacting points of the interior of the crucible 210 and is fire polished. In these embodiments, the height of the weir 300 provides necessary clearance to a shield 350. Using a weir that provides a large open inner melt surface area decreases the oxygen level in the ingot 114. An evaporative oxygen removal subsystem that uses gas flow to remove the oxygen may also be used to reduce the overall level of oxygen within the system.

As a result of supplying solid feedstock material to the outer zone, some of the solid feedstock may become airborne, due to, for example dust, solid feedstock colliding with and bouncing off of other solid feedstock, or bursting of hydrogen bubbles that are formed or released from the solid feedstock during its melting. Pieces of the solid feedstock that become airborne are colloquially referred to as "birds." Using embodiments of this disclosure, during the crystal ingot growing process, these birds are prevented from entering the inner zone and causing a defect or dislocation in the crystal ingot.

The trajectory of every unconstrained bird cannot be determined since large silicon particles of the solid feedstock may bounce off of the melt, collide and recoil with each other, and ricochet off of the system structure. Melt flows in the inner zone can move birds that land in the inner melt surface toward the growing crystal ingot, causing these unmelted silicon particles to contact with, and form a defect or dislocation in the growing crystal ingot. With the large number of possible trajectories of birds or other contamination, a more practical, cost-effective shield is needed. In accordance with embodiments of this disclosure and for improved, reliable crystal growth, the trajectory of these birds is limited to prevent them from entering the inner zone 218, so that the birds are prevented from contacting the growing crystal ingot, especially adjacent the solid-liquid interface.

As noted above, the birds must be prevented from entering the inner or growth zone 216. Referring to FIG. 1, the crystal growing system 100 of this embodiment includes shield 350 adjacent crucible assembly 200. The shield 350 has a conical member 352. However, any suitable horizontally rotated cross-sectional shape that separates the melt 112 from an upper portion of the system 100 and has a central opening to allow the ingot 114 to be pulled therethrough may be used. The conical member 352 covers a portion of the inner and outer zones 218, 220 and has a vertical baffle 354 that extends downward into the annular channel 314, between the inner arm 308 and outer arm 312. The baffle 354 is disposed along the bottom of the conical member 352 at a position that places the baffle between the inner arm 308 and outer arm 312 upon installation of the shield within the system 100. The annular channel 314 forms a toroid that is sized and shaped to accept the baffle 354 therein. The baffle 354 is suitably formed as part of the conical member 352, which may be made integrally or as an assembly of multiple parts. In this embodiment, both the conical member 352 and the baffle 354 are made of graphite or graphite coated with silicon carbide, high purity molybdenum, though other suitable materials may be used.

Birds that strike the baffle 354 may interact with the material of the baffle causing the baffle material to contaminate the birds. To prevent the birds from entering the inner zone 218 and contaminating the melt 112 (in the form of carbon from the graphite shield), the birds are collected and stored in the channel 314, which can be emptied at the completion of the process.

The tops of the inner arm 308 and outer arm 312 form a tangency cone by extending a straight line between the two tops and then rotating the line about the center of the weir 300. In other embodiments, the inner arm 308 and outer arm 312 may have the same height, forming a tangency line or plane between the tops of the inner arm 308 and outer arm 312. The baffle 354 extends downward from the conical member 352 through the tangency plane or cone, piercing the trapezoidal revolution volume defined by the inner arm 308 and outer arm 312, throughout the process to form a tortuous path or labyrinth arrangement to prevent birds and contamination from entering the inner zone 218.

The annular channel 314 forms a well between the inner arm 308 and outer arm 312 that further reduces ricochet trajectories by collecting and storing birds that enter into it. In addition, these birds may have been contaminated by contact with one or both the conical member 352 and baffle 354. Therefore, the contamination is contained within the annular channel 314, preventing the impurities from reaching the growing crystal ingot 114. By preventing the contamination of the inner zone 218, the life cycle of the growing process may be increased.

The spacing between the shoulders 306 and 310, arms 308 and 312, baffle 354, and conical member 352 may be sized for sufficient argon outflow through the labyrinth areas, e.g., to prevent an inward flow of gases that could carry contamination or birds, as shown in FIG. 2. Sufficient argon outflow keeps the very small contamination (e.g. dust or very small particles) from entering the inner zone 218 and causing a defect or dislocation in the ingot.

The baffle 354 may be spaced from the top surface of the shoulders 306 and 310 a minimum distance that is determined by melt splashing condition between the inner arm 308 and outer arm 312 or a predicted bird build up within the annular channel 314. This melt splashing condition typically depends upon purge gas flow, pressure, and temperature, among other factors. The length of the baffle 354, or the distance that the baffle extends toward the shoulders 306 and 310, and beyond the tangency cone, may also depend upon other design considerations.

In this embodiment, the inner arm 308 and outer arm 312 form first and second bottom cylinders that protrude upward from the base 212 of the crucible 210 and melt 112. The baffle 354 forms a top cylinder extending downward from the conical member 352 of the shield 350 to overlap at least one of the first and second bottom cylinders. The cylinders are simple cylinders that form straight lines in tangential projection.

In some embodiments, one or more cylinders may form a complex cylinder that includes inward and/or outward projections or curves. In some embodiments, the shield has more than one downwardly extending baffle or cylinder. In other embodiments, baffles may be disposed at one or more of these locations: inward of the first bottom cylinder or inner arm, between the first bottom cylinder and the second bottom cylinder or outer wall, and outward of the second bottom cylinder.

Weirs in combination with the shields of this disclosure prevent line-of-sight or direct paths from the outer zone, especially from the feedstock tube or channel, to the inner zone. By interrupting the line-of-sight between the outer zone and inner zone, the risk of particle ricochet or some Newtonian trajectory which would allow birds and contamination to enter the inner zone is reduced.

In one embodiment, the line-of-sight between the outer zone and inner zone is interrupted by overlapping cylinders between the upper melt free surface and a shield. In this embodiment, the shield does not have openings extending therethrough, which could otherwise provide birds a path between the outer zone and inner zone.

Further, the configuration of the weir 300 and the shield 350 (specifically, the baffle 354) allows the body 302 of the weir 300 to be located radially outward from where the inner-most weir would typically be located in a conventional system having a baffle disposed between two weirs extending upward from a base of the crucible. Therefore, in this embodiment, the melt within the inner zone has a larger volume and surface area than the melt within the inner zone of a conventional system. The larger volume and mass of the melt within the inner zone results in reduced oxygen concentration in the crystal, and decreased metal impurity segregation and build up in the melt as compared to a conventional system.

Solid feedstock material 116 may be placed into the outer zone 220 from feeder 118 through feed tube 120. The feedstock material 116 is at a much lower temperature than the surrounding melt 112 and absorbs heat from the melt as the feedstock material's temperature rises, and as the solid feedstock material liquefies in the outer zone to form an outer melt portion. As the solid feedstock material 116 (sometimes referred to as "cold feedstock") absorbs energy from melt 112, the temperature of the surrounding melt falls proportionately to the energy absorbed.

The amount of feedstock material 116 added is controlled by feeder 118, which is responsive to activation signals from a controller 122. The amount of cooling of the melt 112 is precisely determined and controlled by controller 122. Controller 122 will either add or not add feedstock material 116 to adjust the temperature and the mass of the melt 112. The addition of feedstock material 116 may be based on the mass of the silicon in the crucible, e.g., by measuring the weight or measuring liquid height of the melt.

As solid feedstock material 116 is added to melt 112, the surface of the melt may be disturbed. This disturbance also affects the ability of the silicon atoms of the melt 112 to properly align with the silicon atoms of the seed crystal 132. However, the weir 300 inhibits inward propagation of the disturbances, as will be discussed below.

Heat is supplied to crucible assembly 200 by one or more heaters 124, 126, and 128 arranged at suitable positions about the crucible assembly. Heat from heaters 124, 126, and 128 initially melts the solid feedstock material 116 and then maintains melt 112 in a liquefied state providing suitable growth conditions for the ingot 114. Heater 124 is generally cylindrical in shape and provides heat to the sides of the crucible assembly 200, and heaters 126 and 128 provide heat to the bottom of the crucible assembly. In some embodiments, heaters 126 and 128 are generally annular in shape. In other embodiments, heaters 126 and 128 are combined into a single heater.

Heaters 124, 126, and 128 are suitably resistive heaters and may be coupled to controller 122. The controller 122 controls electric current provided to the heaters, to control heater power delivery, and the feedstock material to thereby control the temperature of the melt. A sensor 130, such as a pyrometer or like temperature sensor, provides a continuous measurement of the temperature of melt 112 at the crystal/melt interface of the growing single crystal ingot 114. Sensor 130 also may be configured to measure the temperature of the growing ingot. Sensor 130 is communicatively coupled with controller 122. Additional temperature sensors may be used to measure and provide temperature feedback to the controller with respect to points that are critical to the melting of the feedstock material or in controlling the growing ingot. While a single communication lead is shown for clarity, one or more temperature sensor(s) may be linked to the controller by multiple leads or a wireless connection, such as by an infra-red data link or another suitable means.

The amount of current supplied to each of the heaters 124, 126, and 128 by controller 122 may be separately and independently chosen to optimize the thermal characteristics of melt 112. In some embodiments, one or more heaters may be disposed around the crucible to provide heat.

As discussed above, seed crystal 132 is attached to a portion of puller 134 disposed over melt 112. The puller 134 provides movement of seed crystal 132 in a direction perpendicular to the surface of melt 112 allowing the seed crystal to be lowered down toward or into the melt, and raised up or out of the melt. To produce a high quality ingot 114, the melt 112 in an area adjacent to seed crystal 132/ingot 114 must be maintained at a substantially constant temperature and substantially free from surface disruptions, and foreign solid particles must be minimized.

To limit the surface disturbances and temperature fluctuations in the area immediately adjacent to seed crystal 132/ingot 114, the weir 300 is placed in the cavity of the crucible 210. The weir 300 separates the melt 112 into an inner melt portion in the inner zone 218 and an outer melt portion in the outer zone 220. The inner melt portion is inward of weir 300 and is adjacent to the seed crystal 132/ingot 114.

The weir 300 limits movement of melt 112 between the outer melt portion or outer zone 220 and the inner melt portion or inner zone 218. Movement of melt 112 between the zones may be permitted through passage 304 in the lower section of the weir 300.

The movement of melt 112 is substantially limited to the locations of the passage 304. Placing the passage 304 along the lower section of weir 300 confines the movement of melt 112 to along the bottom of the crucible assembly 200. As a result, any movement of melt 112 into the inner zone is at a location beneath or directly opposite to that of the top of the melt, where ingot 114 is being pulled. This confinement of the melt movement limits surface disruptions and temperature fluctuations along the top of the inner melt portion of the melt 112, which limit dislocations in the forming ingot.

The passage 304 permits controlled movement of the melt 112 between the outer zone 220 and the inner zone 218. Inhibiting or limiting movement of the melt 112 between the zones 218, 220 allows the feedstock material 116 in the outer zone to heat to a temperature that is approximately equivalent to the temperature of the inner melt portion as the feedstock material passes into the inner zone.

The crucible 210 and the weir 300 are suitably made of quartz, and the melt 112 and feedstock 116 are silicon. In these embodiments, the silicon melt 112 is corrosive and could cause cut-through of the quartz of the crucible and weir at low pressures to significantly limit the total run time of the system. To prevent excessive erosion of the crucible 210 and weir 300 which would limit the total run time, oxygen is biased upwards by delivering a supply of argon at a pressure of between about 15 and about 75 Torr and a flow of between about 90 and about 140 standard liters per minute (SLPM), or less than about 100 SLPM. The higher oxygen content in the melt surface then limits the quartz erosion rate. The higher pressures reduce the velocity of the argon within the system, resulting in a decrease in silicon monoxide being evaporated from the melt surface. Less silicon monoxide is then carried into the exhaust lines preventing the premature blocking of the exhaust lines and early run termination.

Figure 3:
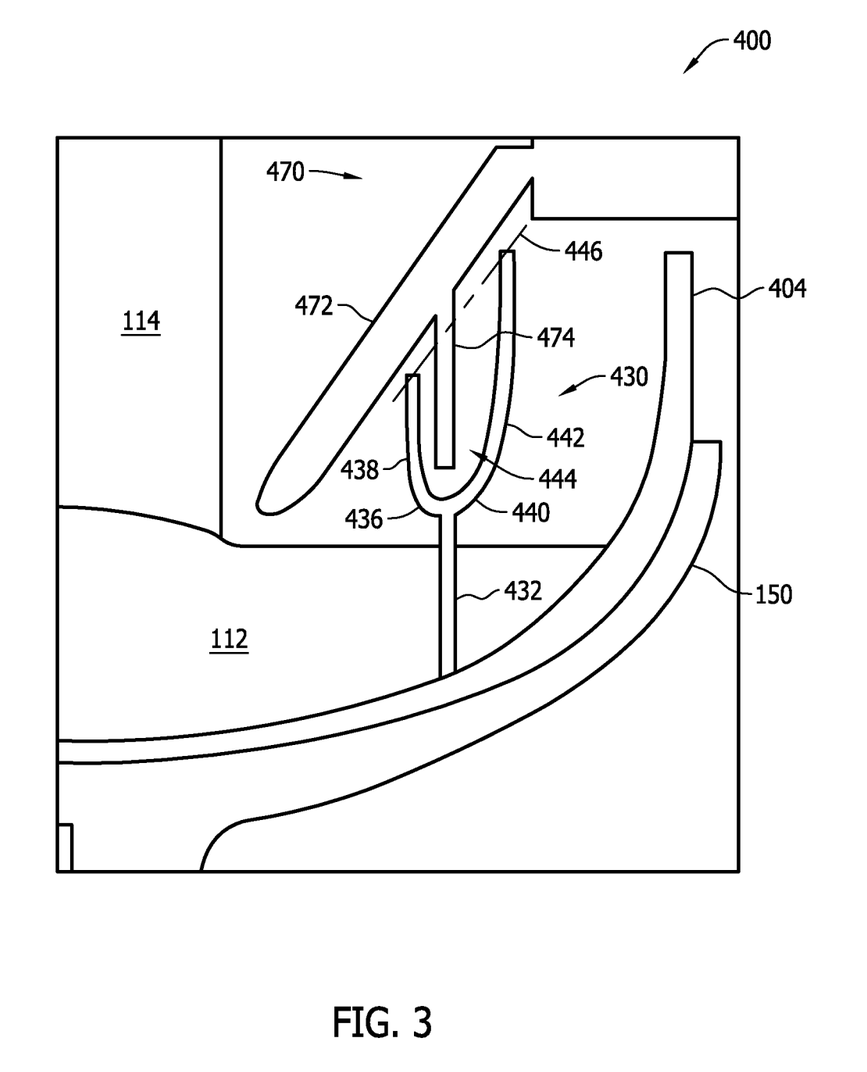
FIG. 3 is a partial cross-sectional view of a crystal growing system in accordance with another embodiment.

Referring to FIG. 3, a crystal growing system 400 having a single crucible 404, a weir 430, and a shield 470 is shown. Weir 430 is substantially similar to weir 300 in that they both include inner and outer arms. Weir 430 differs from weir 300 in that the inner and outer shoulders of weir 430 are arcuate. Weir 430 includes an inner shoulder 436 that extends inward and up from a body 432 along a curve before connecting with an inner arm 438 that extends upward therefrom, and outer shoulder 440 that extends outward and up from the body 432 along a curve before connecting with an outer arm 442 that extends upward therefrom. The inner arm 438 and outer arm 442 form an annular channel 444 that acts as a well to collect and store birds entering therein during the crystal growing process. As shown, the curved inner and outer shoulders 436 and 440 facilitate the argon outflow to prevent stagnation of the outflow gas in this area.

Shield 470 is substantially similar to shield 350 in that they both include a conical member 352, 472 and a downwardly extending baffle 354, 474. The baffle 472 extends through at least a portion of a line between the top edge of the inner arm 438 and outer arm 442. In other words, a tangency cone 446 formed by the tops of the inner arm 438 and outer arm 442 is interrupted by the baffle 474, so that there is no line-of-sight from the outer zone to the inner zone.

Figure 4:
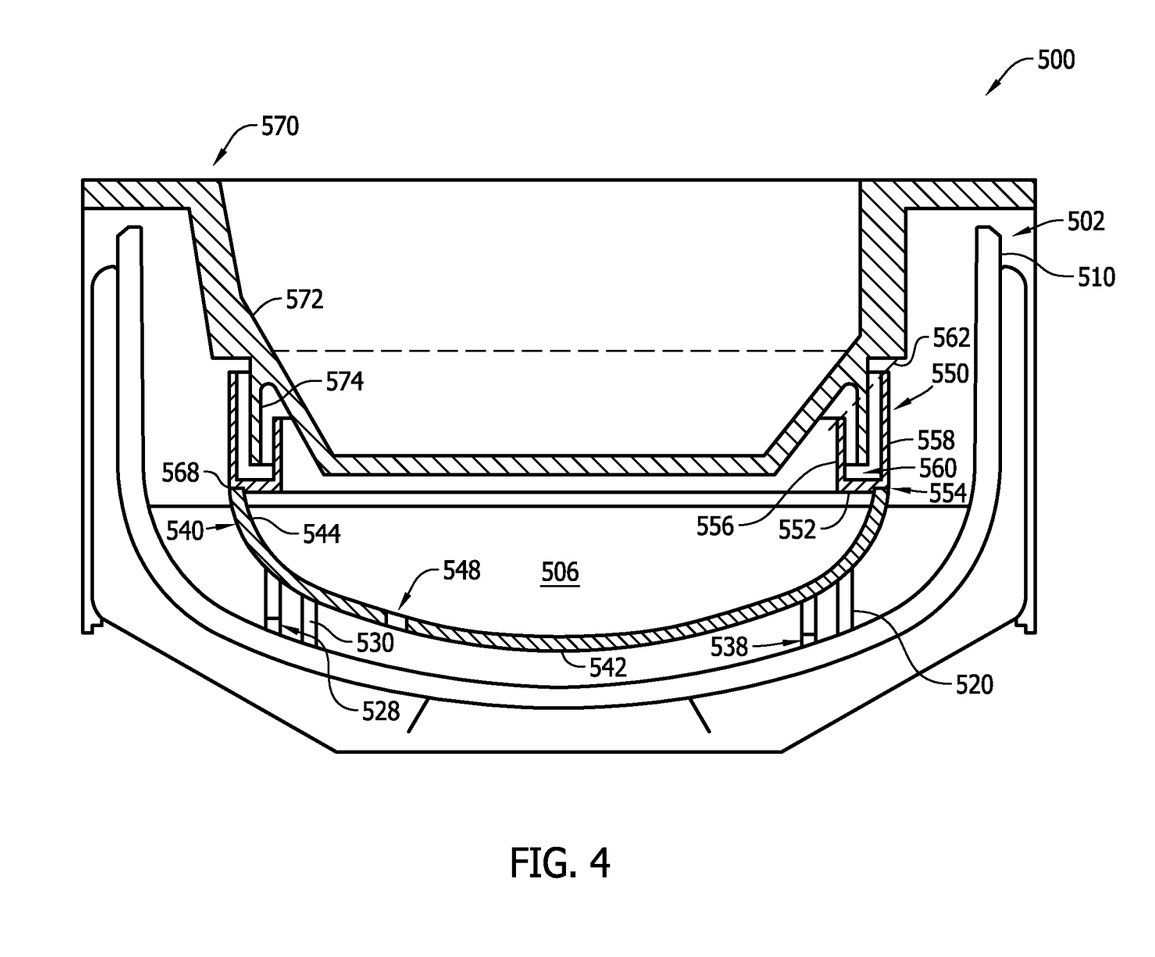
FIG. 4 is a partial cross-sectional view of a crystal growing system in accordance with another embodiment.

With reference to FIG. 4, a crystal growing system 500 in accordance with another embodiment is shown. A melt 506 is generally contained within a crucible assembly 502. The crucible assembly 502 includes a first weir 520 and second weir 530 that support a second crucible 540 within a first crucible 510. This construction separates the melt 506 into an outer zone, multiple intermediate melt zones, and an inner zone, and serves to limit the surface disturbances and temperature fluctuations of the melt 506 in the area adjacent the growing crystal ingot.

Movement of the melt 506 is permitted through passages 528, 538, and 548 extending through each weir 520 and weir 530 and the second crucible 540, respectively. In some embodiments, the passages 528, 538, and 548 may be unaligned to form a tortuous path for the melt from an outer zone, through the intermediate zones, and into the inner zone. Inhibiting the melt movement between the various zones to along the inner surface of the first crucible 510 allows the feedstock or silicon material in the outer zone to heat to a temperature that is approximately equivalent to the temperature of melt in the inner zone as the silicon material passes through the multiple intermediate zones.

The second crucible includes a second base 542 and a second sidewall 544. In the disclosed embodiment, a divider 550 is mounted on or affixed to the top of the second sidewall 544. The divider 550 includes a circumferential pedestal 552 that extends inward from the second sidewall 544, as shown in this embodiment. In other embodiments, the pedestal 552 may extend outward from the sidewall 544 or both inward and outward from the sidewall 544. In this embodiment, the pedestal 552 includes a recess 554 for accepting at least a portion of the second sidewall 544 therein. In another embodiment, the recess 554 is configured to accept at least a portion of one of the arms 556, 558 therein. In other embodiments, the divider and second crucible are formed as a unitary structure.

In this embodiment, the recess 554 extends into the pedestal at a perpendicular angle. In other embodiments, the recess 554 extends into the pedestal 552 at an angle. In some embodiments, the pedestal 552 forms an angle with the sidewall 544 such that gas flow is not inhibited under the portion of the pedestal 552 adjacent the growing crystal 114.

An inner arm 556 extends upward along an inner edge of the pedestal 554 and an outer arm 558 extends upward along an outer edge of the pedestal. In this embodiment, the pedestal 552, the inner arm 556, and the outer arm 558 are formed as a single unit. In other embodiments, the pedestal 552, the inner arm 556, and the outer arm 558 may be formed as separate units that are assembled together. In these embodiments, the pedestal 552, the inner arm 556, and the outer arm 558 may be bonded together or include interconnecting structure. In some embodiments, the pedestal 552 may be formed with one of the inner arm 556 and the outer arm 558 as a single unit, and assembled with the other arm.

The inner arm 556 and outer arm 558 form an annular channel 560 that acts as a well to collect and store birds entering therein during the crystal growing process, as discussed above with respect to the annular channel 314. In this embodiment, the inner arm 556 and outer arm 558 are parallel to each other and perpendicular to the pedestal 552. In other embodiments, at least one of the inner arm 556 and outer arm 558 may form an angle with the other, and an oblique angle with the pedestal 552.

The divider 550 may be made of graphite, quartz, or silicon carbide. A seal 568, such as high temperature bonding agents or interlocking components between the divider 550 and the sidewall 540, may be located between the sidewall 540 and divider 550, such as within the recess 554.

Shield 570 includes a conical member 572 and a baffle 574 similar to shield 350 and 470. The bottom of the baffle 574 extends through or breaks a tangency cone 562 formed by the inner arm 556 and outer arm 558, as discussed above with respect to the baffle 354 and the inner arm 308 and outer arm 312 of weir 300.

Figure 5:
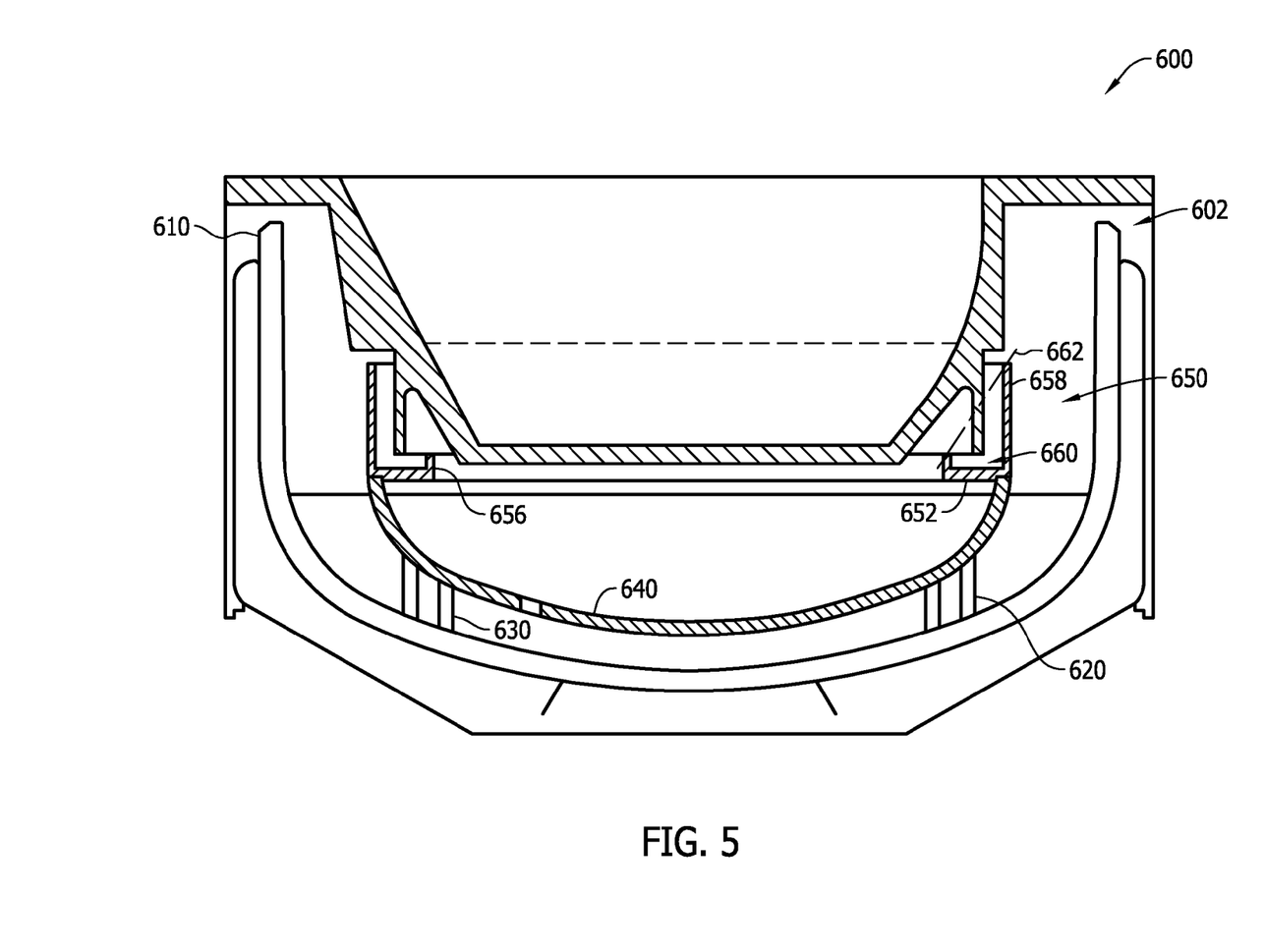
FIG. 5 is a partial cross-sectional view of a crystal growing system in accordance with another embodiment.

With reference to FIG. 5, a crystal growing system 600 in accordance with another embodiment is shown. The crystal growing system 600 includes a crucible assembly 602 that is similar to crucible assembly 502. The crucible assembly 602 includes a first weir 620 and second weir 630 that support a second crucible 640 within a first crucible 610.

A divider 650 is mounted on or affixed to the top of the second crucible 640. Divider 650 is substantially similar to divider 550 in that they both include a base and an inner arm and an outer arm. Divider 650 differs from divider 550 in that divider 650 has a pedestal 652, an inner arm 656, and an outer arm 658 that are of different lengths than pedestal 552, inner arm 556, and outer arm 558. Together, pedestal 652, inner arm 656, and outer arm 658 form channel 660 for collecting and storing birds that enter therein. As discussed above, a tangency cone 662 is formed by the top of the inner arm 656 and outer arm 658.

Referring again to FIGS. 1 and 2, in a method of one embodiment for growing a single crystal ingot 114 in a crucible assembly 200 having a crucible 210 with a base 212 and a sidewall 214, a barrier or weir 300 is placed in the crucible. The weir 300 includes a body 302 with an inner shoulder 306 connected with an upwardly extending inner arm 308, and an outer shoulder 310 connected with an upwardly extending outer arm 312. The inner arm 308 and outer arm 312 form an annular channel 314 that is elevated or spaced above the base 212.

The area inward of the weir 300 defines an inner zone 218. The area between the sidewall 214 and the weir 300 defines an outer zone 220. Feedstock material 116 is placed in the outer zone 220. Heaters 124, 126 and 128 are placed adjacent to the crucible assembly 200 to provide heat for liquefying or melting the feedstock material 116, forming a melt 112. Once liquefied, the melt 112 moves from the outer zone 220 into the inner zone 218. The movement of the melt 112 between the zones is limited to a passage 304 through the weir 300.

The seed crystal 132 is lowered into and then slowly raised out of the melt 112 to grow the ingot from the seed crystal. As the seed crystal 132 is slowly raised, silicon atoms from the melt 112 align with and attach to the silicon atoms of the seed crystal 132 allowing the ingot to grow larger and larger as a monocrystal. The raising of the silicon atoms from the melt 112 causes them to cool and solidify.

Inhibiting movement of the melt between the zones inhibits or prevents unmelted feedstock material from passing into the inner zone 218 and causing a dislocation in the ingot. Unmelted feedstock may disturb or negatively affect the structural integrity and the crystal structure of the ingot being formed.

In addition, the temperature of the melt increases as the melt passes from the outer zone to the inner zone. By the time the melt reaches the inner zone, the melt is substantially equivalent in temperature to the melt already in the inner zone. Raising the temperature of the melt before reaching the inner zone reduces the temperature fields within the inner zone. The controller may act to maintain a substantially constant temperature within the inner zone.

Further, inhibiting movement of the melt between the zones to through the passage allows the surface of the inner zone to remain relatively undisturbed. The weir substantially prevents disturbances in the outer zone from disrupting the surface of the melt in the inner zone by substantially containing the thermal and mechanical energy waves produced by the disturbances in the outer zone. The disturbances are also inhibited from passing into the inner zone by the location of the passage. The passage is disposed below the melt top level contact to allow movement of the melt into the inner zone without disrupting the surface stability of the inner zone.

In some embodiments, the temperature of the melt in the inner zone may suitably be measured at a location immediately adjacent the growing ingot by a sensor. In other embodiments, the temperature of the melt in the outer zone may suitably be measured. The sensor is connected with the controller. The controller adjusts the temperature of the melt by supplying more or less current to the heaters and by supplying more or less feedstock material to the melt. The controller is also capable of simultaneously supplying feedstock material while the seed crystal is raised from the melt, growing the ingot.

In a method of another embodiment for growing a single crystal ingot in a crucible assembly of any of the embodiments, the melt is separated into at least an inner zone and outer zone by a barrier that has at least two bottom cylinders extending upward therefrom. The solid feedstock material is supplied and liquefied into a melt in the outer zone and a crystal ingot is simultaneously grown in the inner zone. The space above the melt is separated by at least one top cylinder that extends below the top of the bottom cylinders at a location between the bottom cylinders to interrupt a line-of-sight path between the inner zone and outer zone. The top cylinder is spaced above the bottom of the annular channel to prevent the melt or unmelted feedstock in the annular channel from contacting or splashing onto it. The top and bottom cylinders may be simple or complex cylinders (e.g., cylinders that include inward and/or outward projections or curves).

The bottom cylinders and top cylinder are disposed to form a reduced opening therebetween. The reduced opening increases the argon outflow rate passing therethrough at a given argon flow, pressure, and temperature, without causing the argon outflow to be restricted or stagnated. This configuration facilitates a positive radial drift of argon outflow gas that carries dust particles (generally silicon, but sometimes other contamination) outward and away from the inner zone where the crystal ingot is being grown. Since there is a low mass density of purge gas in a rarefied furnace atmosphere of 15 to 70 Torr, such a reduced opening will affect the trajectory predominantly of very small particles.

In some embodiments, the two bottom cylinders form a tangent plane or cone across their uppermost points. In these embodiments, the top cylinder, e.g. the baffle 254, is sized and shaped to break the tangent plane or cone radially within the two bottom cylinders and thereby break the line-of-sight from the inner zone to the outer zone.

Embodiments consistent with this disclosure may advantageously reduce the oxygen concentration in the ingot to compensate for an increase in operating pressure to extend run life, lower the consumption rate of the weir, and provide better system performance through slower quartz dissolution. In some embodiments, the annular channel forms a cross-sectional cup on top of the body, which is a single walled barrier. The cup extends inward over the melt from the barrier to provide larger inner and outer zones than are formed by the use of multiple weirs. Thus, use of the single walled barrier reduces the oxygen concentration in the crystal and decreases metal impurity segregation and build up in the melt.

The annular channel may create a local dead-zone or "gas shield" in the argon gas flow near the top of the weir at the melt-gas interface, which reduces the rate at which the weir or crucible erodes at the melt-gas interface. Therefore, the useful life of the package or runtime of the furnace is increased because the weir and crucible do not have to be replaced as often.

The larger outer zone or feed region prevents icing in the outer feed region, allows for faster feeding and liquefying of the feedstock material in the outer zone and allows higher growth rates of the ingot. The labyrinth flow provides a well for collecting and storing airborne feedstock or birds during a run of the crystal forming system or crystal growing process. Reducing disturbances in the surface of the melt increases the yield of zero dislocation (ZD) ingots.

Additionally, use of embodiments consistent with this disclosure may reduce the risk of contaminating the melt, and the risk of loss of structure in the crystal ingot caused by birds entering the inner zone by the use of a weir having an upwardly extending annular channel that mates with a downwardly extending baffle. The reduction in risk and improved efficiency and runtime not only increase the overall production of the crystal forming system, but also lowers overall operational costs.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A system for growing a crystal ingot from a melt, the system comprising:
   a first crucible having a first base and a first sidewall forming a first cavity for containing the melt;
   a barrier disposed within the first cavity of the first crucible to inhibit movement of the melt from outward of the barrier to inward of the barrier, the barrier extending from the first base to above the melt to be contained therein, the barrier having an inner arm and an outer arm extending upward to form a channel therebetween; and
   a shield extending downward between the inner arm and the outer arm to inhibit passage of contaminants.

2. The system of claim 1, wherein one of the arms is spaced at a greater distance from the barrier than the other arm.

3. The system of claim 1, wherein the inner arm is connected with the barrier through an inner shoulder and the outer arm is connected with the barrier through an outer shoulder, the inner shoulder and the outer shoulder spacing the inner arm and the outer arm from the barrier.

4. The system of claim 3, wherein at least one of the inner shoulder and the outer shoulder curves outward and upward from the barrier.

5. The system of claim 1, wherein one of the arms forms an oblique angle with at least one of the other arm and the barrier.

6. The system of claim 1, wherein the barrier is formed as a single unit with at least one of the arms.

7. The system of claim 1, wherein the barrier is a second crucible having a passage therethrough.

8. A system for growing a crystal ingot from a melt, the system comprising:
   a first crucible having a first base and a first sidewall forming a first cavity for containing the melt;
   a barrier disposed within the first cavity of the first crucible to inhibit movement of the melt from a location outward of the barrier to a location inward of the barrier;
   a divider disposed on top of the barrier, the divider having an upwardly extending inner arm and an upwardly extending outer arm; and
   a shield extending downward between the inner arm and the outer arm to inhibit passage of contaminants.

9. The system of claim 8, wherein the divider includes a pedestal connecting the inner arm with the outer arm.

10. The system of claim 9, wherein the pedestal includes an annular recess to receive at least a portion of the barrier therein.

11. The system of claim 10, wherein the pedestal includes a seal disposed within the annular recess.

12. The system of claim 9, wherein the pedestal is formed as a single unit with at least one of the arms.

13. The system of claim 9, wherein the pedestal and one of the arms is bonded together.

14. The system of claim 9, wherein one of the arms forms an oblique angle with at least one of the other arm, the pedestal, and the barrier.

15. The system of claim 9, wherein the pedestal and one of the arms include interconnecting structure.

16. The system of claim 15, wherein the interconnecting structure is a recess in the pedestal for accepting a portion of one of the arms therein.

17. The system of claim 8, wherein one of the arms is spaced at a greater distance from the barrier than the other arm.

18. The system of claim 8, wherein the barrier is a second crucible having a passage therethrough.

19. The system of claim 18, further comprising a second barrier located between the first crucible and the second crucible.

20. The system of claim 8, wherein the inner arm has an inner length and the outer arm has an outer length, the inner length is unequal to the outer length.

* * * * *